219-121 CROSS REFEREN SEARCH RO

July 14, 1970 F. J. JANNETT 3,520,055

METHOD FOR HOLDING WORKPIECES FOR RADIANT ENERGY BONDING

Filed April 26, 1967

INVENTOR
F. J. JANNETT
BY W L Williamson
ATTORNEY

United States Patent Office
3,520,055
Patented July 14, 1970

3,520,055

METHOD FOR HOLDING WORKPIECES FOR RADIANT ENERGY BONDING

Frederick Joseph Jannett, West Millington, N.J., assignor to Western Electric Company, Incorporated, New York, N.Y., a corporation of New York Filed Apr. 26, 1967, Ser. No. 633,854
Int. Cl. H01r *43/00*; H05k *3/30*
U.S. Cl. 29—628 17 Claims

ABSTRACT OF THE DISCLOSURE

A vacuum is employed to draw a flexible transparent cover about at least two workpieces to hold the workpieces in alignment relative to each other without interfering with the application of radiant energy to the workpieces. In addition, facilities are disclosed for permitting displacement of the workpieces without disturbing the alignment of the workpieces relative to each other to bring a selected area of the workpieces into alignment with an optical axis of a radiant energy source. This permits the application of radiant energy to the workpieces to bond the workpieces together.

BACKGROUND OF THE INVENTION

The invention is concerned with a method for holding at least two workpieces in alignment relative to each other without interfering with the application of radiant energy to the workpieces. The invention is also concerned with a method for aligning the workpieces with an optical axis of a beam of radiant energy without disturbing the alignment of the circuits relative to each other.

The Bell System is utilizing a two-material approach to integrated circuits, see October/November 1966 issue of the Bell Laboratories Record. Active components such as transistors and diodes as well as their interconnections are formed on a silicon wafer employing the silicon transistor manufacturing technology while precision resistors and capacitors are formed on glass or alumina substrates employing the tantalum thin-film technology. The two-material approach permits the mass manufacture of active components such as transistors and diodes and passive components such as capacitors and resistors having the high quality required for use in communication systems.

As will be appreciated, it is necessary that the silicon integrated circuits such as beam lead devices and the tantalum circuits be reliably and inexpensively interconnected together. The application of radiant energy to leads of one circuit to bond the leads to contact areas of another circuit has been found suitable for making interconnections having the desired quality, but difficulty is experienced in holding the circuits in proper alignment relative to each other without interfering with the application of radiant energy to the circuits. In addition, where a plurality of leads or beam lead devices are to be bonded to a tantalum circuit, difficulty is experienced in aligning the leads or beam lead devices with the optical axis of the radiant energy source without disturbing the alignment of the circuits relative to each other. Also, where a fusion weld is employed to bond leads to associated contact areas, difficulty is encountered in holding the leads in intimate engagement with the contact areas to insure a satisfactory bond without interfering with the application of radiant energy.

It is, therefore, an object of this invention to provide a method for holding at least two workpieces in proper alignment relative to each other without interfering with the application of radiant energy to the workpieces.

Another object of this invention is to provide a method for holding at least two workpieces in proper alignment relative to each other while permitting displacement of the workpieces relative to an optical axis of a beam of radiant energy without disturbing the alignment of the workpieces relative to each other.

Still another object of this invention is to provide a method for holding at least two workpieces in intimate engagement with each other without interfering with the application of radiant energy so that a satisfactory fusion bond may be achieved upon the application of radiant energy.

SUMMARY OF THE INVENTION

With the above objects and others in view, the method of this invention contemplates covering at least two workpieces with a flexible transparent cover, and drawing a vacuum to pull the transparent cover about the workpieces to hold the circuits in a predetermined position relative to each other.

In addition, the method of this invention also contemplates displacing a vacuum chamber relative to an optical axis of a beam of radiant energy to bring a predetermined portion of the workpieces into alignment with the optical axis, and locking the vacuum chamber in position.

DETAILED DESCRIPTION

Figures 1, 2:
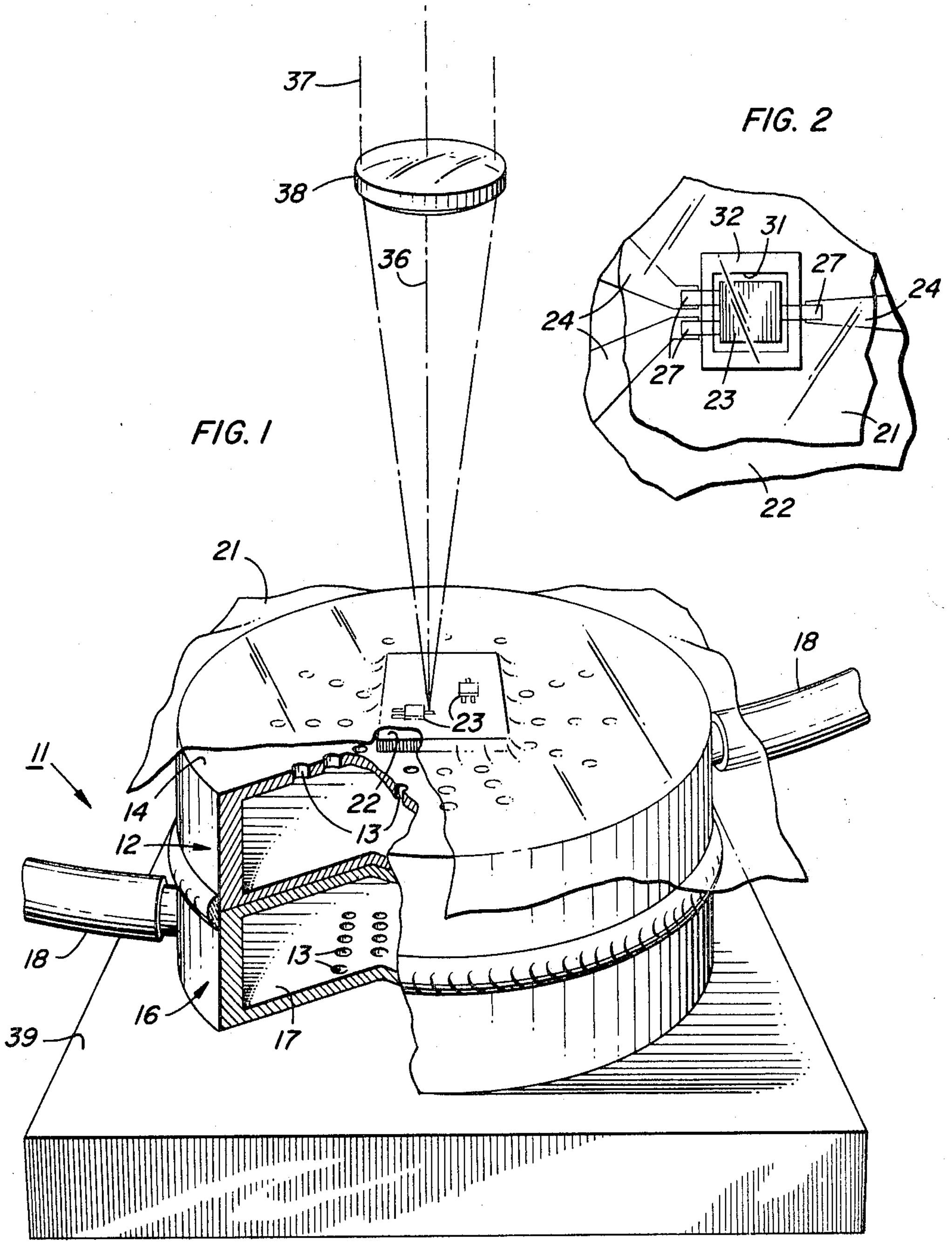
FIG. 1 is a perspective view partly in cross-section of a double chambered vacuum chuck suitable for the practice of the method of the invention.
FIG. 2 is an enlarged view taken from FIG. 1 showing a portion of two circuits which are suitable for the practice of this invention.

The details of vacuum chuck 11 as illustrated in FIG. 1 will now be discussed preparatory to a discussion of the method of this invention. The double chambered vacuum chuck 11 is illustrated with an upper vacuum chamber 12 having a plurality of apertures 13—13 in its upper surface 14 and with chamber 12 welded to a lower vacuum chamber 16 having a plurality of apertures 13—13 in its lower surface 17. A vacuum may be drawn on the chambers 12 and 16 by connecting the chambers to a suitable vacuum source (not shown) such as a vacuum pump by suitable conduits 18—18 such as rubber hoses. By a conventional valving arrangement (not shown), a vacuum may be selectively drawn on either or both of chambers 12 and 16.

The method of this invention includes the steps of (1) covering at least two workpieces with a flexible transparent cover and (2) drawing a vacuum to pull the cover about the workpieces to hold the workpieces in alignment relative to each other.

A flexible transparent cover 21, see FIG. 1, such as a sheet of polytetrafluoroethylene commonly sold under the trademark "Teflon" may be employed to cover workpieces such as circuit 22 and circuits 23—23. As illustrated in FIG. 2, where circuit 22 is a thin-film circuit having a plurality of contact areas 24—24 and circuits 23—23 are silicon integrated circuits such as beam lead circuits having a plurality of leads 27—27 extending therefrom, the circuits 22 and 23 are held in alignment relative to each other with each lead 27 properly aligned with its respective contact area 24 so that upon the application of radiant energy the leads will be bonded to the contact areas. By drawing a vacuum on a vacuum chamber, such as, for example, vacuum chamber 12 of a vacuum chuck 11, the cover 21 is pulled down over or about the circuits to hold the circuits in alignment relative to each other. For example, the vacuum pulls the cover 21 down over circuits 22 and 23 to hold circuit 23 against circuit 22 so that each lead 27 is held in alignment with its respective contact area 24.

The circuits 23—23 may be aligned with the circuit 22 by punching an aperture 31 in the transparent cover 21 and placing an adhesive patch 32 over the aperture (FIG. 2). By placing the aperture 31 over a circuit 23 and pressing the adhesive patch 32 into engagement with the circuit 23, the circuit 23 may be made to adhere to the cover 21. The circuit 23 may then be positioned relative to circuit 22 with each lead 27—27 properly aligned with its respective contact area 24 by displacing the cover 21 until the desired position is achieved. After the circuits 22 and 23 are bonded together, the adhesive patch 32 is readily pulled from the circuit 23 with removal of the cover 21. However, any suitable technique may be employed for positioning the workpieces relative to each other before applying a vacuum to draw the cover 21 down over the workpieces to hold the workpieces in a desired position.

Also, it is frequently desirable that the leads 27—27 be in intimate engagement with contact areas 24—24. For example, in laser bonding, a fusion weld is frequently employed to bond workpieces together. When a fusion weld is employed to bond a lead 27 to a contact area 24, sufficient energy is applied to render a portion of the lead and contact area molten. If the lead is not in intimate engagement with the contact area, the lead will not be bonded to the contact area when the molten material cools. Drawing a flexible transparent cover about the circuits does bring the leads into intimate engagement with the contact areas so that a satisfactory fusion weld is achieved.

The transparent flexible cover 21 should be sufficiently flexible to conform generally to the circuits when a vacuum is drawn so as to hold the circuits firmly together. A 0.50-mil thick sheet of Teflon has been found suitable for holding a beam lead circuit in alignment on a thin-film circuit. An average beam lead circuit is from 15 to 80 mils wide and from 30 to 90 mils long. The cover 21 should be substantially transparent to the radiant energy to be applied to the circuits so as not to interfere with the application of the radiant energy to the circuits. A Teflon sheet has been found satisfactory when the radiant energy source is a ruby laser operating at a wavelength of 6,934 angstroms.

As will be appreciated, the method of this invention is not restricted to any particular type of workpiece and may be practiced whenever it is desired to hold at least two workpieces in alignment relative to each other without interfering with the application of radiant energy to the workpiece. However, the method has particular application in holding at least two circuits relative to each other during the application of radiant energy to the circuits. In addition, the method is not restricted to any particular type of circuit or to any particular circuit configuration. For example, the circuits 22 and 23 may be merely a resistive and/or conductive path formed on a suitable substrate or it may include one or more passive components such as resistors and capacitors and/or one or more active components such as transistors and diodes.

The method also has application regardless of how the radiant energy is applied to the workpieces. For example, the radiant energy may be applied generally to the whole workpiece area from a source of radiant energy such as an infrared or ultraviolet lamp, or the radiant energy may be applied to a selected area of the workpieces by focusing the energy from a radiant energy source such as a laser, infrared lamp or ultraviolet lamp on a selected area. For example, if a solder connection between the circuits is desired, the leads 27—27 and/or contact areas 24—24 may be precoated with solder and the entire circuit area exposed to a source of radiant energy such as an infrared lamp or ultraviolet lamp, or the radiant energy source can be focused to a line and the line of radiant energy swept across the circuits to solder each lead to its respective contact area.

The method may also include the steps of (1) displacing the workpieces to align a predetermined area of the workpieces with an optical axis of a beam of radiant energy and (2) holding the workpieces in position relative to the optical axis.

In many applications, it is necessary to position the circuits 22 and 23 so that a beam of radiant energy may be applied to a selected area of the circuits, for example, to an individual lead 27. As will be appreciated, if the vacuum applied to the cover 21 is broken to permit the circuits to be displaced into alignment with optical axis 36 of a beam 37 of radiant energy, such as a laser beam focused to a point by a suitable lens 38, great difficulty will be experienced in maintaining the alignment of the circuits relative to each other during such displacement. However, by displacing the circuits without breaking the vacuum on the cover 21, these difficulties may be avoided. For example, by displacing the vacuum chuck 11 without breaking the vacuum applied to chamber 12, the circuits may be positioned relative to the optical axis 36 without disturbing the alignment of the circuits relative to each other. Alignment with an optical axis as used herein refers to bringing a selected area of a workpiece into position so that when the radiant energy source is actuated, the radiant energy will strike the desired area area of the workpiece.

After the circuits are properly aligned relative to the optical axis 36, the circuits should be held in position so as to avoid misalignment prior to or during the application of radiant energy. This may be acomplished by applying a vacuum to chamber 16 so as to hold or lock the vacuum chuck 11 to a surface 39. As will be appreciated, any suitable technique may be employed for holding the vacuum chuck in position. For example, the surface 39 may be provided with an electromagnet to magnetically lock the vacuum chuck in the desired position.

As will be appreciated by one skilled in the art, the method of this invention is not limited to the specific application disclosed and may be practiced wherever it is desired to hold at least two workpieces in alignment relative to each other during the positioning of the workpieces and/or during the application of radiant energy. In addition, the method of this invention is not restricted to any particular type or configuration of vacuum chuck or to any particular type of flexible transparent cover and many changes and modifications will be apparent to one skilled in the art without departing from the spirit of the invention.

What is claimed is:

1. A method for holding at least two workpieces having surfaces which will bond to each other upon the application of sufficient radiant energy thereto in a predetermined position to permit the application of radiant energy to the workpieces, comprising the steps of:
   - positioning the workpieces relative to each other to align the surfaces which will bond to each other,
   - covering the workpieces with a flexible transparent cover,
   - drawing a vacuum to pull the cover about the workpieces to hold the workpieces with said surfaces in engagement with each other,
   - applying sufficient radiant energy to the workpiece through the transparent cover to bond the surfaces together, and
   - releasing the vacuum to thereby release the cover from the workpieces.

2. A method for holding at least two workpieces having surfaces which will bond to each other upon the application of sufficient radiant energy thereto in a predetermined position to permit the application of radiant energy to the workpieces, comprising the steps of:

positioning the first workpiece in a predetermined position relative to the second workpiece to align the surfaces which will bond to each other, covering the workpieces with a flexible transparent cover, drawing a vacuum to pull the cover about the workpieces to hold the workpieces with said surfaces in engagement with each other, applying sufficient radiant energy to the workpieces through the transparent cover to bond the surfaces together, and releasing the vacuum to thereby release the cover from the workpieces.

3. A method for holding a first circuit in a predetermined position relative to a second circuit to permit the application of sufficient radiant energy to the circuits to bond the circuits together, wherein the first circuit has at least one lead extending therefrom and the second circuit has an associated contact area, comprising the steps of:

positioning the circuits with each lead in alignment with an associated contact area, covering the circuits with a flexible transparent cover, drawing a vacuum to pull the cover about the circuits to hold each first circuit in position relative to the second circuit with each lead in intimate engagement with its associated contact area, applying sufficient radiant energy to each lead through the transparent cover to bond each lead to its associated contact area, and releasing the vacuum to thereby release the cover from the circuits.

4. A method for holding at least two workpieces in a predetermined position relative to each other and for positioning the workpieces relative to an optical axis of a beam of radiant energy while maintaining the workpieces in position relative to each other to permit the application of radiant energy to selected areas of the workpieces, comprising the steps of:

covering the workpieces with a flexible transparent cover, drawing a vacuum on a vacuum chamber to pull the cover down over the workpieces to hold the workpieces in position relative to each other, displacing the vacuum chamber to bring a selected area of the workpieces into alignment with the optical axis of the beam of radiant energy, locking the vacuum chamber in position, and applying the beam of radiant energy through the transparent cover to the selected area of the workpieces.

5. The method of claim 4, comprising the additional steps of:

unlocking the vacuum chamber, displacing the vacuum chamber to bring another selected area of the workpieces into alignment with the optical axis of the beam of radiant energy, locking the vacuum chamber in position, applying the beam of radiant energy through the transparent cover to the newly selected area of the workpieces, and repeating the last four steps seriatim until radiant energy is applied to a desired number of areas.

6. A method for holding at least one circuit in a predetermined position relative to a second circuit and for positioning the circuits relative to an optical axis of a beam of radiant energy while maintaining the circuits in position relative to each other to permit the application of radiant energy to selected areas of the circuits to bond selected areas of the circuits together, comprising the steps of:

covering the circuits with a flexible transparent cover, drawing a vacuum on a vacuum chamber to pull the cover about the circuits to hold the circuits in position relative to each other, displacing the vacuum chamber to bring a selected area of the circuits into alignment with the optical axis of the beam of radiant energy, locking the vacuum chamber in position, and applying the beam of radiant energy through the transparent cover to the selected area of the circuits to bond the selected area of the circuits together.

7. The method of claim 6, comprising the additional steps of:

unlocking the vacuum chamber, displacing the vacuum chamber to bring another selected area of the circuits into alignment with the optical axis of the beam of radiant energy, locking the vacuum chamber in position, applying the beam of radiant energy through the transparent cover to the newly selected area of the circuits to bond the newly selected area of the circuits together, and repeating the last four steps seriatim until radiant energy is applied to a desired number of areas.

8. A method for holding at least one first circuit in a predetermined position relative to a second circuit and for positioning the circuits relative to an optical axis of a beam of radiant energy while maintaining the circuits in position relative to each other to permit the application of radiant energy to selected areas of the circuits to bond the circuits together wherein each first circuit has at least one lead extending therefrom aligned with an associated contact area on the second circuit, comprising the steps of:

covering the circuits with a flexible transparent cover, drawing a vacuum on a vacuum chamber to pull the cover about the circuits to hold each first circuit in position relative to the second circuit with at least one lead in intimate engagement with its associated contact area, displacing the vacuum chamber to bring a selected number of leads into alignment with the optical axis of the beam of radiant energy, locking the vacuum chamber into position, and applying the beam of radiant energy through the transparent cover to the selected number of leads to bond the selected number of leads to each associated contact area.

9. The method of claim 8, comprising the additional steps of:

unlocking the vacuum chamber, displacing the vacuum chamber to bring another selected number of leads into alignment with the optical axis of the beam of radiant energy, locking the vacuum chamber in position, applying the beam of radiant energy through the transparent cover to the newly selected number of leads to bond the selected number of leads to each associated contact area, and repeating the last four steps seriatim until a desired number of leads are bonded to their associated contact area.

10. A method for holding at least one beam lead device in alignment relative to a second circuit and for positioning the circuits relative to an optical axis of a beam of radiant energy to bond the circuits together wherein a selected number of leads of each beam lead device is aligned with an associated contact area on the second circuit, comprising the steps of:

covering the circuits with a flexible transparent cover, drawing a vacuum on a first chamber of a vacuum chuck to pull the cover about the circuits and hold the circuits together with each aligned lead in intimate engagement with its associated contact area, displacing the vacuum chuck to bring a predetermined number of leads into alignment with the optical axis of the beam of radiant energy, drawing a vacuum on a second chamber of the vacuum chuck to lock the vacuum chuck in position, and applying the beam of radiant energy through the transparent cover to the predetermined number of leads to bond the predetermined number of leads to each associated contact area.

11. The method of claim 10, comprising the additional steps of:

releasing the vacuum on the second chamber of the vacuum chuck to unlock the chuck, displacing the vacuum chuck to bring another predetermined number of leads into alignment with the optical axis of the beam of radiant energy, drawing a vacuum on the vacuum chuck to lock the chuck in position, applying the beam of radiant energy to the newly selected predetermined number of leads through the transparent cover to bond the predetermined number of leads to each associated contact area, and repeating the last four steps seriatim until a desired number of leads are bonded to their associated contact areas.

12. A method for holding a first workpiece in alignment relative to a second workpiece, wherein each workpiece has a surface which will bond to each other upon the application of sufficent radiant energy thereto, comprising the steps of:

securing the first workpiece to a flexible transparent cover, placing the first workpiece on the second workpiece, displacing the cover to bring the first workpiece into a predetermined position relative to the second workpiece with the surfaces in alignment with each other, drawing a vacuum to pull the cover about the workpieces to hold the workpieces in position relative to each other, applying sufficient radiant energy to the workpieces through the transparent cover to bond the surfaces together, and releasing the vacuum to thereby release the cover from the workpieces.

13. A method for holding a first circuit in alignment relative to a second circuit to permit the application of sufficient radiant energy to the circuits to bond the circuits together, wherein the first circuit has at least one lead extending therefrom and the second circuit has an associated contact area, comprising the steps of:

providing a flexible transparent cover with an aperture, securing the first circuit in the aperture, placing the first circuit on the second circuit, displacing the cover to bring the first workpiece into a predetermined position relative to the second workpiece with each lead in alignment with its associated contact area, drawing a vacuum to pull the cover about the circuits to hold the circuits in position relative to each other with each lead in intimate engagement with its associated contact area, applying sufficient radiant energy to the circuits through the transparent cover to bond, each lead to its associated contact area, and releasing the vacuum to thereby release the cover from the circuits.

14. A method for holding a first circuit in a predetermined position relative to a second circuit and for positioning the circuits relative to an optcal axis of a beam of radiant energy while maintaining the circuits in position relative to each other to permit the application of radiant energy to selected areas of the circuits to bond the circuits together wherein the first circuit has at least one lead extending therefrom aligned with an associated contact area on the second circuit, comprising the steps of:

punching an aperture in a flexible transparent cover, covering the aperture with an adhesive patch, placing the adhesive patch in engagement with the first circuit to attach the first circuit to the cover, placing the first circuit on the second circuit, displacing the cover to bring the first circuit into a predetermined position relative to the second circuit with at least one lead in intimate engagement with its associated contact area, drawing a vacuum on a vacuum chamber to pull the cover about the circuits to hold the circuits in the predetermined position, displacing the vacuum chamber to bring a selected number of leads into alignment with the optical axis of the beam of radiant energy, locking the vacuum chamber into position, and applying the beam of radiant energy through the transparent cover to the selected number of leads to bond a selected number of leads to each associated contact area.

15. The method of claim 14, comprising the additional steps of:

unlocking the vacuum chamber, displacing the vacuum chamber to bring another selected number of leads into alignment with the optical axis of the beam of radiant energy, locking the vacuum chamber in position, applying the beam of radiant energy through the transparent cover to the newly selected number of leads to bond the selected number of leads to each associated contact area, and repeating the last four steps seriatim until a desired number of leads are bonded to their associated contact area.

16. A method for holding a first circuit in a predetermined position relative to a second circuit and for positioning the circuits relative to an optical axis of a beam of radiant energy while maintaining the circuits in position relative to each other to permit the application of radiant energy to selected areas of the circuits to bond the circuits together wherein the first circuit has at least one lead extending therefrom aligned with an associated contact area on the second circuit, comprising the steps of:

punching an aperture in a flexible transparent cover, covering the aperture with an adhesive patch, placing the adhesive patch in engagement with the first circuit to attach the circuit to the cover, placing the first circuit on the second circuit, displacing the cover to bring the first circuit into alignment with the second circuit with at least one lead extending from the first circuit into alignment with an associated contact area on the second circuit, drawing a vacuum on a first chamber of a vacuum chuck to pull the cover about the circuits and hold the circuits together in the predetermined position, displacing the vacuum chuck to bring a selected number of leads into alignment with the optical axis of the beam of radiant energy, drawing a vacuum on a second chamber of the vacuum chuck to lock the vacuum chuck in position, and applying the beam of radiant energy through the transparent cover to the selected number of leads to bond the selected number of leads to each associated contact area.

17. The method of claim 16, comprising the additional steps of:

releasing the vacuum on the second chamber of the vacuum chuck to unlock the chuck, displacing the vacuum chuck to bring another selected number of leads into alignment with the optical axis of the beam of radiant energy, drawing a vacuum on the vacuum chuck to lock the chuck in position, applying the beam of radiant energy to the newly selected number of leads through the transparent cover to bond the selected number of leads to each associated contact area, and repeating the last four steps seriatim until a desired number of leads are bonded to their associated contact areas.

References Cited

UNITED STATES PATENTS

| | | | |
|---|---|---|---|
| 2,861,405 | 11/1958 | Hanford. | |
| 2,991,193 | 7/1961 | Fessler et al. | |
| 2,991,600 | 8/1961 | Lancaster. | |
| 3,108,881 | 10/1963 | Shaw et al. | 99—214 XR |
| 3,194,668 | 7/1965 | Schlein et al. | 99—171 |
| 3,374,531 | 3/1968 | Bruce | 29—502 XR |
| 3,304,403 | 2/1967 | Harper | 219—121 |
| 3,369,101 | 2/1968 | Di Curcio | 219—121 |
| 3,388,465 | 6/1968 | Johnson | 29—493 XR |

OTHER REFERENCES

"Laser Welding," December 1965 issue Welding Journal, p. 1024 relied upon.

JOHN F. CAMPBELL, Primary Examiner

R. W. CHURCH, Assistant Examiner

U.S. Cl. X.R.

29—25.41, 57, 59, 203, 423, 493, 621, 626; 99—171; 156—275; 219—121; 228—44; 269—21